US012224012B2

(12) United States Patent
Miranda et al.

(10) Patent No.: US 12,224,012 B2
(45) Date of Patent: Feb. 11, 2025

(54) ALL LEVEL COARSE/FINE PROGRAMMING OF MEMORY CELLS

(71) Applicant: Micron Technology, Inc., Boise, ID (US)

(72) Inventors: Lawrence Celso Miranda, San Jose, CA (US); Tomoko Ogura Iwasaki, San Jose, CA (US); Sheyang Ning, San Jose, CA (US); Jeffrey S. McNeil, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 18/127,768

(22) Filed: Mar. 29, 2023

(65) Prior Publication Data

US 2023/0317171 A1 Oct. 5, 2023

Related U.S. Application Data

(60) Provisional application No. 63/327,611, filed on Apr. 5, 2022.

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *G11C 16/08* (2013.01); *G11C 16/24* (2013.01); *G11C 16/26* (2013.01)

(58) Field of Classification Search
CPC ..... G11C 16/10; G11C 16/0483; G11C 16/08; G11C 16/24; G11C 16/26; G11C 2211/5621; G11C 11/5628
(Continued)

(56) References Cited

U.S. PATENT DOCUMENTS 11,004,525 B1 * 5/2021 Gautam ............. G11C 16/3495
2012/0201077 A1 * 8/2012 Nagao ................ G11C 16/3459
365/185.18
(Continued)

*Primary Examiner* — Michael T Tran
(74) *Attorney, Agent, or Firm* — LOWENSTEIN SANDLER LLP

(57) ABSTRACT

Described are systems and methods for all level coarse/fine programming of memory cells. An example memory device comprises: a memory array comprising a plurality of memory cells electrically coupled to a plurality of wordlines and a plurality of bitlines; and a controller coupled to the memory array, the controller to perform operations comprising: identifying a set of memory cells for performing a memory programming operation, wherein the memory cells are electrically coupled to a target wordline and a set of target bitlines; causing a first voltage to be applied to the target wordline, wherein the first voltage is incremented every time period over a number of time periods that corresponds to a number of threshold voltages to be programmed; causing a second voltage to be applied to a first bitline over the number of time periods; causing a third voltage to be applied to a second bitline, wherein the third voltage is incremented during a second time period of the number of time periods, wherein the second time period follows a first time period; causing a fourth voltage to be applied to a third bitline, wherein the fourth voltage is incremented during a third time period of the number of time periods, wherein the third time period follows the second time period; and causing a fifth voltage to be applied to a fourth bitline over the number of time periods.

20 Claims, 10 Drawing Sheets

(51) Int. Cl.
*G11C 16/08* (2006.01)
*G11C 16/24* (2006.01)
*G11C 16/26* (2006.01)

(58) Field of Classification Search
USPC .......................................... 365/193, 230.06
See application file for complete search history.

(56) References Cited

U.S. PATENT DOCUMENTS

| | | | |
|---|---|---|---|
| 2013/0176783 A1* | 7/2013 | Senoo ................... | G11C 16/20 |
| | | | 365/185.29 |
| 2018/0182449 A1* | 6/2018 | Kim ..................... | G11C 11/4091 |
| 2019/0006013 A1* | 1/2019 | Lee ........................ | G11C 16/08 |
| 2020/0194077 A1* | 6/2020 | Sanad ................... | G11C 16/24 |
| 2020/0219569 A1* | 7/2020 | Lee ........................ | G11C 16/26 |
| 2020/0227125 A1* | 7/2020 | Yang ..................... | G11C 16/08 |
| 2020/0243145 A1* | 7/2020 | Yamada ................ | G11C 5/063 |
| 2021/0012834 A1* | 1/2021 | Hsu ....................... | G11C 16/08 |
| 2021/0020226 A1* | 1/2021 | Lim ...................... | G11C 13/003 |
| 2021/0027829 A1* | 1/2021 | Kim ...................... | G11C 13/003 |
| 2021/0027835 A1* | 1/2021 | Lee ....................... | G11C 13/0026 |
| 2021/0027837 A1* | 1/2021 | Kim ..................... | G11C 13/0061 |
| 2021/0065773 A1* | 3/2021 | Takekida ............... | G11C 16/08 |
| 2021/0090620 A1* | 3/2021 | Yang .................... | G11C 7/1087 |
| 2021/0118502 A1* | 4/2021 | Janjua ................. | G11C 13/0026 |
| 2021/0125672 A1* | 4/2021 | Wei ..................... | G11C 11/5628 |
| 2021/0125673 A1* | 4/2021 | Tachi ................... | G11C 11/5628 |
| 2022/0084586 A1* | 3/2022 | Nakagawa ............. | G11C 16/08 |

* cited by examiner

ALL LEVEL COARSE/FINE PROGRAMMING OF MEMORY CELLS

REFERENCE TO RELATED APPLICATIONS

This application claims the benefit of U.S. Provisional Application No. 63/327,611, filed Apr. 5, 2022, which is incorporated by reference herein.

TECHNICAL FIELD

Embodiments of the disclosure relate generally to memory sub-systems, and more specifically, to all level coarse/fine programming of memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
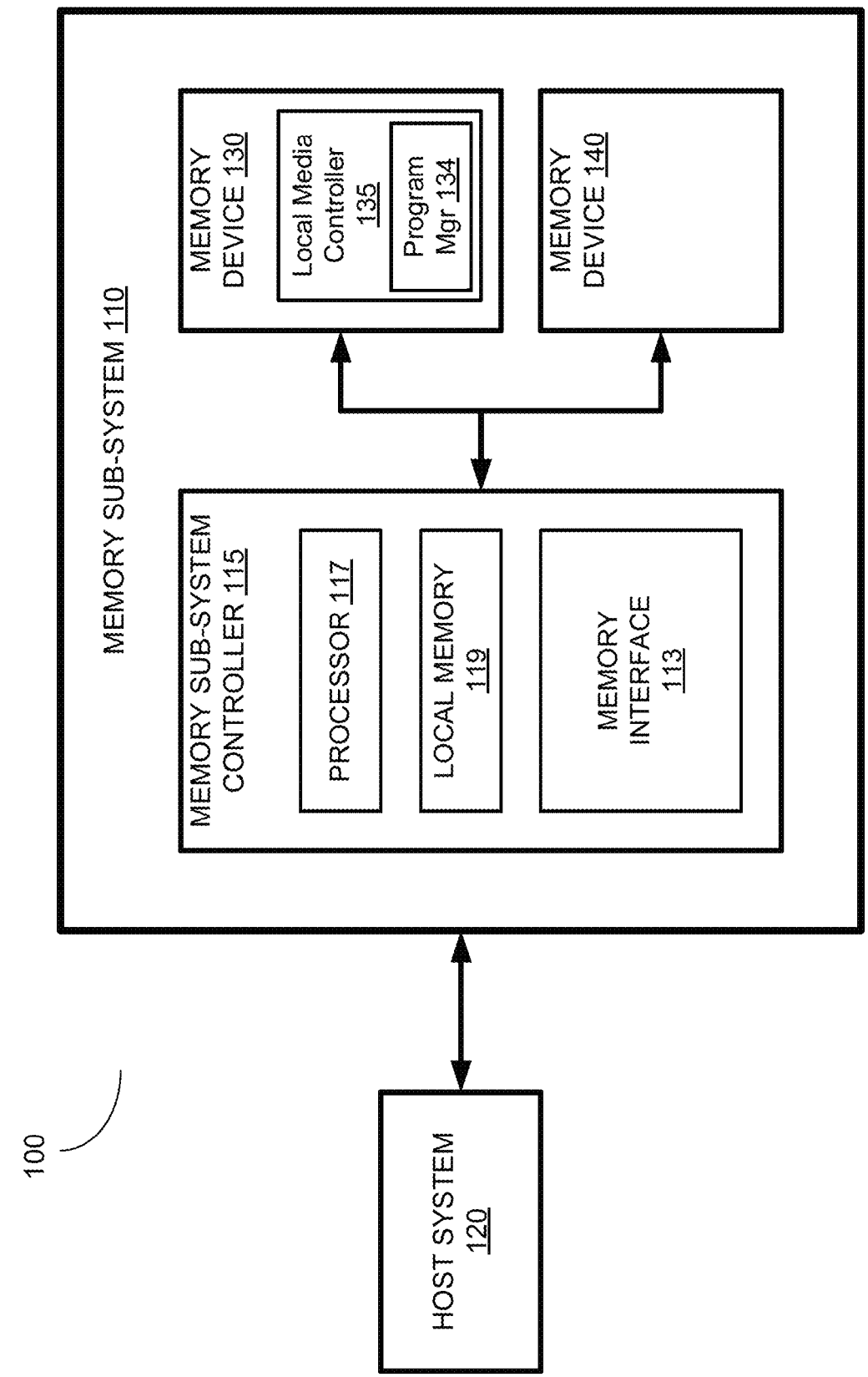
FIG. 1 illustrates an example computing system that includes a memory sub-system in accordance with some embodiments of the present disclosure.

Aspects of the present disclosure are directed to all level coarse/fine programming of memory cells. One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include of one or more planes. For some types of non-volatile memory devices (e.g., NAND devices), each plane includes of a set of physical blocks. In some implementations, each block can include multiple sub-blocks. Each sub-block includes a set of memory cells ("cells"). A memory cell is an electronic circuit that stores information. Depending on the cell type, a memory cell can store one or more bits of information, and its charge level can define various logic states that correlate to the number of bits being stored. The logic states can be represented by binary values, such as "0" and "1", or combinations of such values. Each block and sub-block can be selectively accessed by memory access operations (e.g., read, write, erase operations).

Memory cells can be formed on a silicon wafer in an array of columns (also hereinafter referred to as "bitlines") and rows (also hereinafter referred to as wordlines). A wordline refers to one or more rows of memory cells of a memory device that are used with one or more bitlines to generate the address of each of the memory cells. The intersection of a bitline and wordline defines the address of the memory cell.

A block refers to a unit of the memory device used to store data and can include a group of memory cells, a word line group, a word line, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) so as to form an array of strings in a block of memory (e.g., a memory array). The compact nature of certain non-volatile memory devices, such as 3D flash NAND memory, means that word lines are common to many memory cells within a block of memory. Some memory devices use certain types of memory cells, such as triple-level cell (TLC) or quadruple level cell (QLC), which store three bits of data in each memory cell, which make it affordable to move more applications from legacy hard disk drives to newer memory sub-systems, such as NAND solid-state drives (SSDs).

Memory access operations (e.g., a programming (write) operation, an erase operation, etc.) can be executed with respect to the memory cells by sequentially applying programming voltage pulses to selected wordlines, which are connected to the target memory cells. In some implementations, the programming pulse voltage can be sequentially ramped up from the initial voltage value (e.g., 0V) to the final voltage value (e.g., $V_{PGM\ MAX}$).

In order to satisfy various operational and data reliability requirements, the threshold voltage distributions of programmed memory cells should conform to certain parameters, such as distribution width (e.g., the difference between the maximum and minimum threshold voltage of a group of memory cells that have been programmed to the same logical level). Furthermore, TLC and QLC memory devices, due to the higher number of the logical levels, impose more stringent requirements to the width of the threshold voltage distributions.

Memory cell programming involves applying series of incrementing voltage programming pulses to the target memory cells in order to gradually increase their charge level. In order to produce sufficiently tight threshold voltage distributions, higher numbers of programming voltage pulses may be needed, thus adversely affecting the timing and other efficiency characteristics of memory programming operations.

Systems and methods of the present disclosure alleviate the above-noted and other deficiencies, by performing programming operations in two stages: a coarse programming stage and a fine programming stage. The purpose of the coarse programming stage is the faster portion of the programming operation and is utilized to placing the charge levels of the cells close to the desired levels and thus reducing the coupling effects of neighboring cells. The fine programming stage utilizes smaller programming voltage increments than the coarse programing stage and is intended for placing the charge levels of the cells to their respective desired levels.

While conventional programing techniques are iterative processes that start at the lowest logical target level and progress towards the highest logical target level, the methods and systems of the present disclosure are able to program the memory cells at all logical levels simultaneously, thus providing significant performance advantages.

In some embodiments, the memory controller can perform one or more programming operations in order to program each memory cell to a desired logical level. In some embodiments, the memory controller causes the target memory cells to be programmed simultaneously at all logical levels by boosting the pillars in a staggered manner based on the target logical level of respective memory cells, while ramping up the voltage applied to the unselected wordlines to the pass voltage level and the voltage applied to the selected wordline(s) to the programming voltage level, as the described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc.

The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In some embodiments, instructions implementing methods 800 and/or 900 described herein below can be stored as instructions (e.g., firmware) on memory device 130 and the program manager 134 can be implemented as control logic (e.g., local media controller 135) executing these instructions.

In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, program manager 134 can receive data to be programmed to the memory device 130 (e.g., a TLC memory device). Accordingly, program manager 134 can perform one or more programming operations to program each memory cell to a desired logical level (e.g., L1-L15 for QLC). In some embodiments, program manager 134 causes the target memory cells to be programmed simultaneously at all logical levels (e.g., L1-15 for QLC). This can be achieved by boosting the pillars in a staggered manner based on the target logical level of respective memory cells, while ramping up the voltage applied to the unselected wordlines to the pass voltage level ($V_{PASS}$) and the voltage applied to the selected wordline(s) to the programming voltage level ($V_{PGM}$), as the described in more detail herein below.

Figure 2:
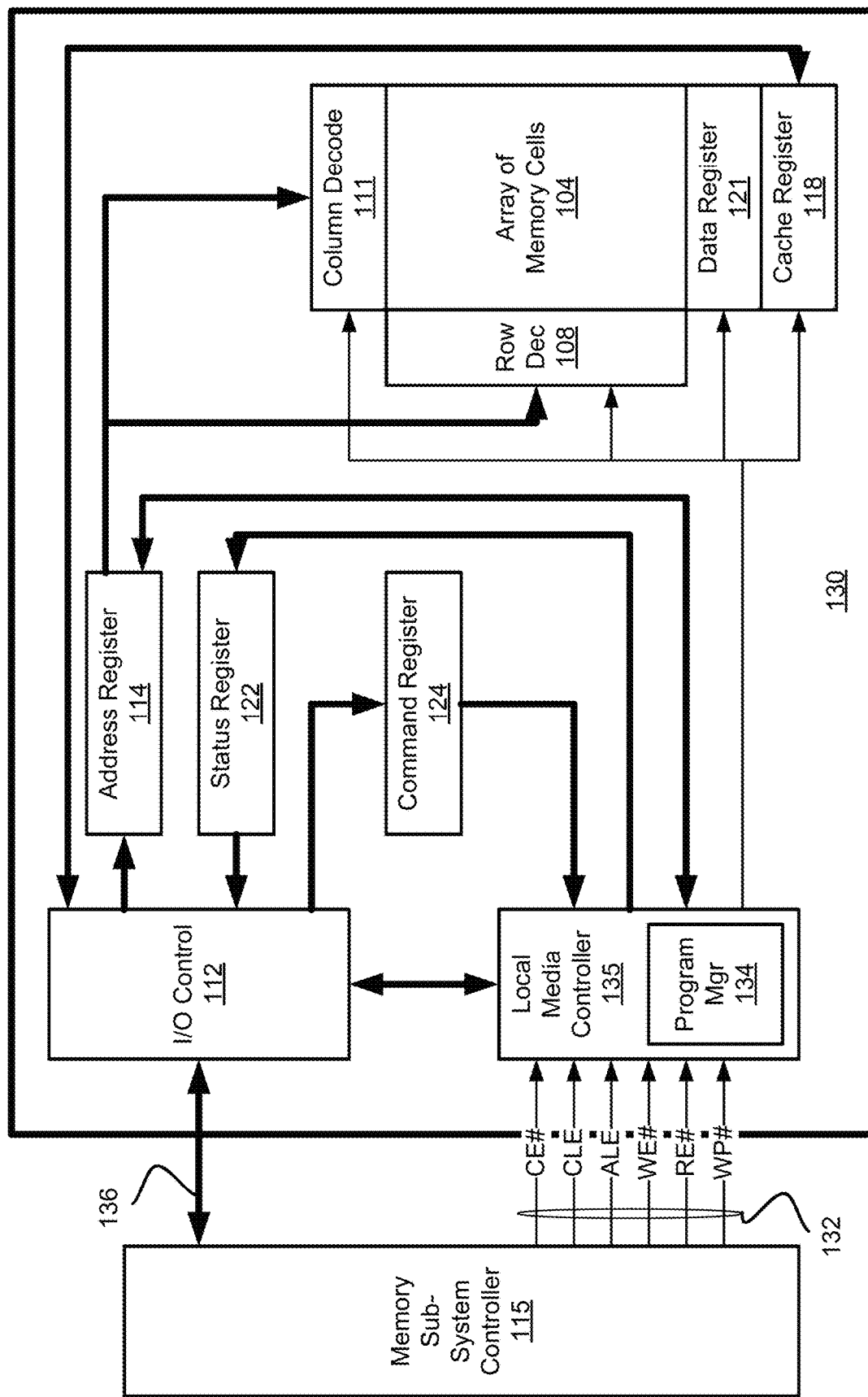
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 2) of at least a portion of array of memory cells 104 are capable of being programmed to one of at least two target data states.

Row decode circuitry 108 and column decode circuitry 111 are provided to decode address signals. Address signals are received and decoded to access the array of memory cells 204. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 108 and column decode circuitry 111 to control the row decode circuitry 108 and column decode circuitry 111 in response to the addresses. In one embodiment, local media controller 135 includes programming manager 134, which can implement the memory programming operations with respect to memory device 130, as described herein.

The local media controller 135 is also in communication with a cache register 218. Cache register 118 latches data, either incoming or outgoing, as directed by the local media controller 135 to temporarily store data while the array of memory cells 104 is busy writing or reading, respectively, other data. During a programming operation (e.g., a write operation), data may be passed from the cache register 118 to the data register 121 for transfer to the array of memory cells 204; then new data may be latched in the cache register 118 from the I/O control circuitry 212. During a read operation, data may be passed from the cache register 118 to the I/O control circuitry 112 for output to the memory sub-system controller 115; then new data may be passed from the data register 121 to the cache register 218. The cache register 118 and/or the data register 121 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 112 and may then be written into command register 224. The addresses may be received over input/output (I/O) pins [7:0] of I/O bus 136 at I/O control circuitry 112 and may then be written into address register 214. The data may be received over input/output (I/O) pins [7:0] for an 8-bit device or input/output (I/O) pins [15:0] for a 16-bit device at I/O control circuitry 112 and then may be written into cache register 218. The data may be subsequently written into data register 121 for programming the array of memory cells 204.

In an embodiment, cache register 118 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

One or more memory devices of the memory sub-system 100 can be represented, e.g., by NAND memory devices that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a conductive bitline (BL), which can be shared by multiple memory cells. A memory device can include an array or memory cells that are connected to a plurality of wordlines (WL) and a plurality of bitlines (BL), as schematically illustrated by FIG. 4. A memory device can further include circuitry for selectively coupling WLs and BLs to voltage sources providing control gate and source-drain signals, which is omitted from FIG. 4 for clarity and conciseness.

Figure 3B:
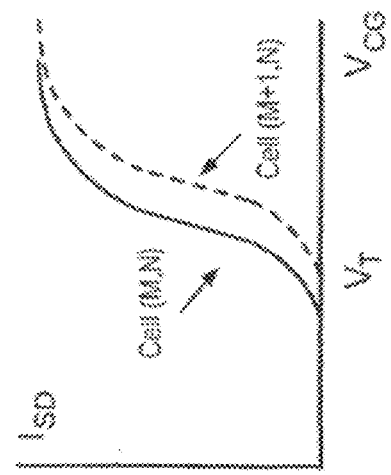
FIG. 3B schematically illustrates schematically dependence of the source-drain current on the control gate voltage for two memory cells.

Referring again to FIG. 3A, memory cells 302 and 304 can be connected to the same bitline N and two different conductive wordlines, M and M+1, respectively. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG}<V_T$, the source-drain electric current can be low, but can increase substantially once the control gate voltage has exceeded the threshold voltage, $V_{CG}>V_T$. Transistors of the same memory device can be characterized by a distribution of their threshold voltages, $P(V_T)=dW/dV_T$, so that $dW=P(V_T)dV_T$ represents the probability that any given transistor has its threshold voltage within the interval $[V_T, V_T+dV_T]$. For example, FIG. 3B illustrates schematically dependence of the source-drain current $I_{SD}$ on the control gate voltage for two memory cells, e.g. memory cell 302 (solid line) and memory cell 304 (dashed line), having different threshold control gate voltages.

Figure 3A:
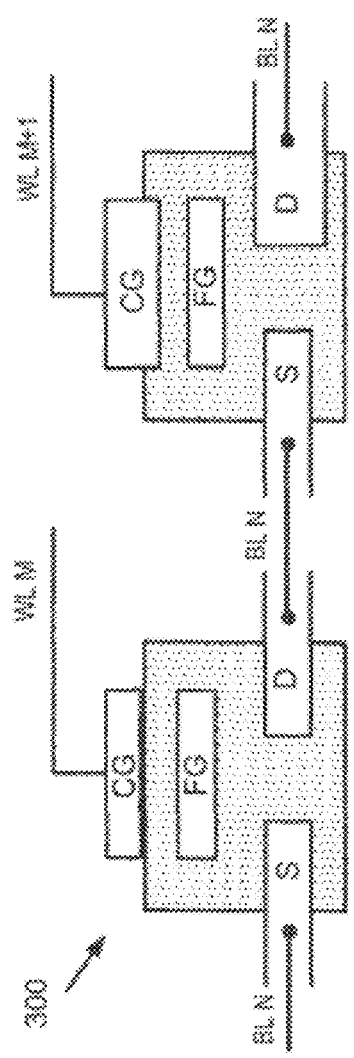
FIG. 3A schematically illustrates a set of memory cells as arranged in a memory device.
Figure 4:
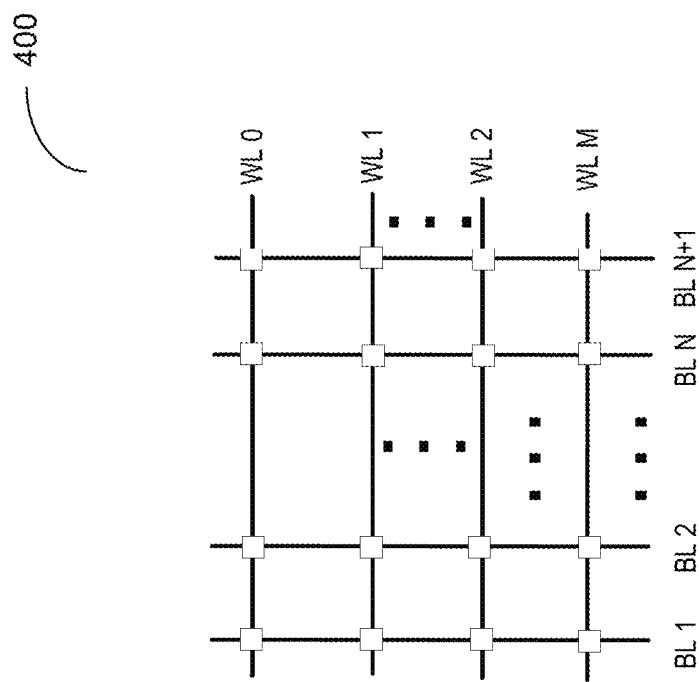
FIG. 4 schematically illustrates an example memory array.

To make a memory cell non-volatile, the cell can be further equipped with a conducting island—a charge storage node—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the charge storage node can receive an electric charge Q, which can be permanently stored thereon even after the power to the memory cell—and, consequently, the source-drain current—is ceased. The charge Q can affect the distribution of threshold voltages $P(V_T,Q)$. Generally, the presence of the electric charge Q shifts the distribution of threshold voltages towards higher voltages, compared with the distribution $P(V_T)$ for an uncharged charge storage node. This happens because a stronger positive control gate voltage $V_{CG}$ can be needed to overcome a negative potential of the charge storage node charge Q. If any charge of a sequence $Q_k$ of charges with $1 \le k \le 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that 2N distributions $P(V_T, Q_k)$ are interspaced with $2^N-1$ valley margins.

Figure 3C:
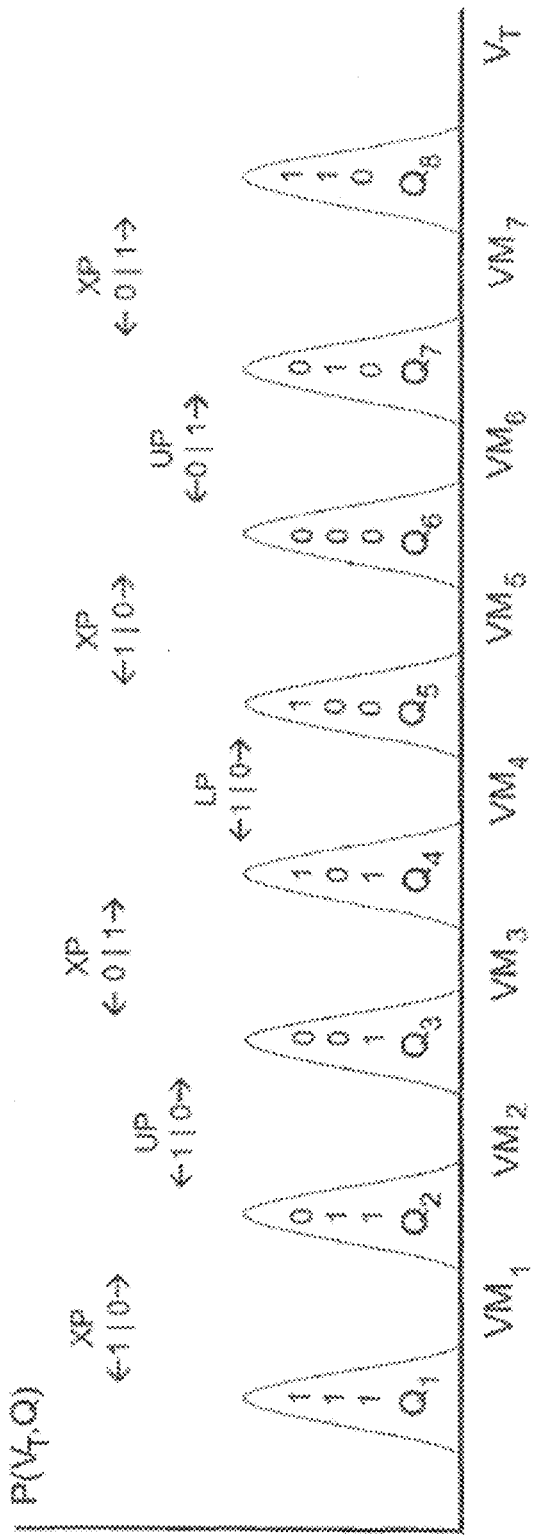
FIG. 3C schematically illustrates an example distribution of threshold control gate voltages for a memory cell.

FIG. 3C illustrates schematically a distribution of threshold control gate voltages for a memory cell capable of storing three bits of data by programming the memory cell into at least eight charge states (also referred to as "programming levels") that differ by the amount of charge on the cell's charge storage node. FIG. 3C shows distributions of threshold voltages $P(V_T, Q_k)$ for $2^N=8$ different charge states of a tri-level cell (TLC) separated with $2^3-1=7$ valley margins $VM_k$. Accordingly, a memory cell programmed into a charge state k-th (i.e., having the charge $Q_k$ deposited on its charge storage node) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

Memory devices can be classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In general, the operations described herein can be applied to memory devices having N-bit memory cells, where N>1.

For example, a TLC can be capable of being in one of eight charging states $Q_k$ (where the first state is an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 215.

As noted herein above, the memory controller 215 can program a state of the memory cell and then read can read this state by comparing a read threshold voltage $V_T$ of the memory cell against one or more read level thresholds. The read operation can be performed after a memory cell is placed in one of its charged states by a previous programming operation, which can include one or more programming passes. Each programming pass would apply appropriate programming voltages to a given wordline in order place appropriate charges on the charge storage nodes of the memory cells that are connected to the wordline.

A programming operation involves a sequence of programming voltage pulses that are applied to a selected wordline. Referring again to FIG. 3A, the source (S) and drain (D) electrodes of a memory cell can be connected to a conductive bitline shared by multiple memory cells. A programming operation would apply a sequence of programming voltage pulses to the control gate (CG) via a corresponding wordline (WL). Each programming voltage pulse would induce an electric field that would pull the electrons onto the charge storage node. After each programming pulse is applied to the selected wordline, a verify operation can be performed by reading the memory cell in order to determine whether the threshold voltage $V_T$ of the memory cell has reached a desired value (voltage verify level). If the threshold voltage $V_T$ of the memory cell has reached the verify voltage associated with the desired state, the bitline to which the memory cell is connected can be biased at the program inhibit voltage, thus inhibiting the memory cells that are coupled to the bitline from being further programmed, i.e., to prevent the threshold voltage $V_T$ of the memory cells from shifting further upward in response to subsequent programming pulses applied to the selected wordline.

Figure 5:
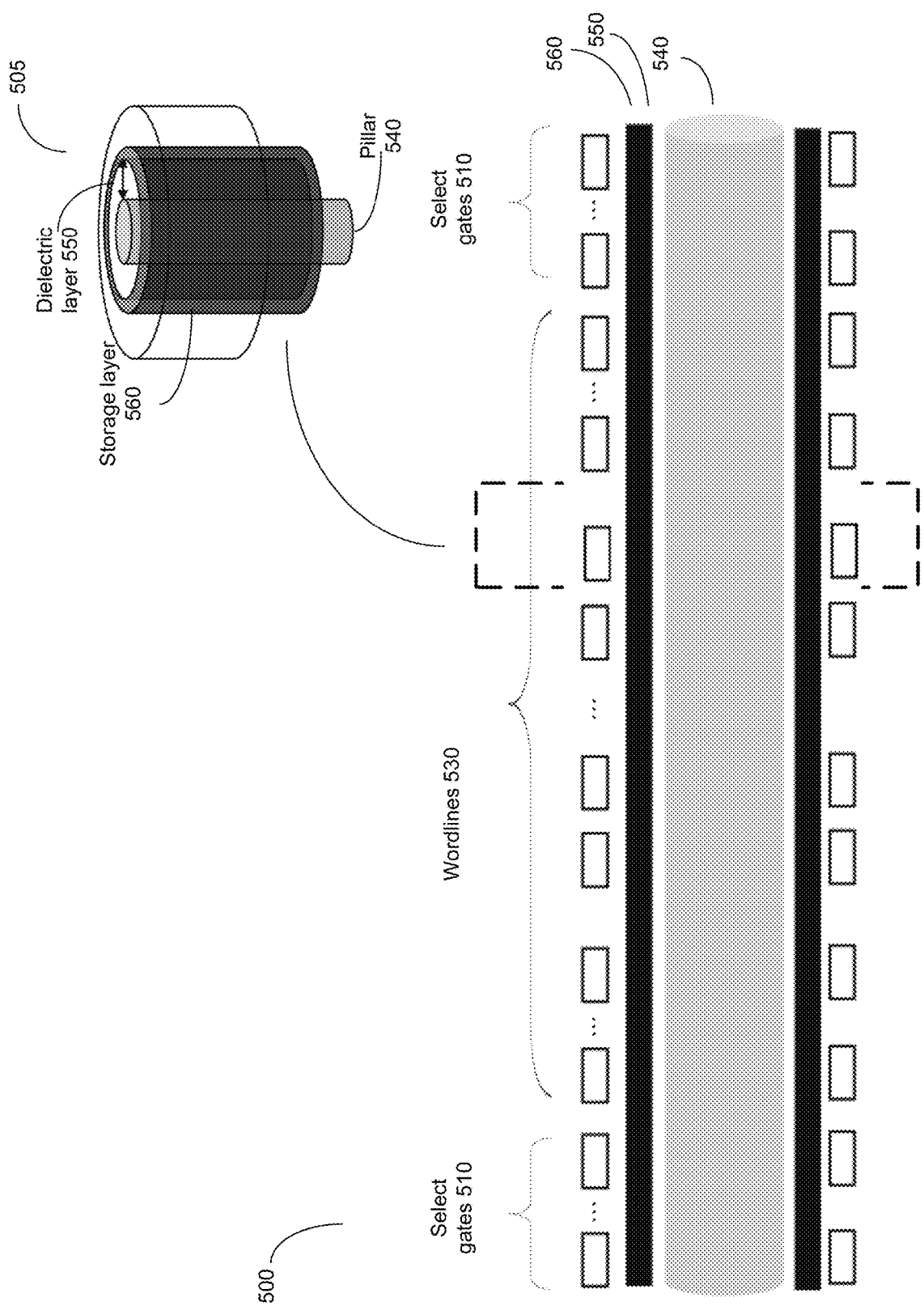
FIG. 5 schematically illustrates an example memory device operating in accordance with aspects of the present disclosure.

FIG. 5 schematically illustrates a three-dimensional structure of an example memory device operating in accordance with aspects of the present disclosure. As shown in FIG. 5, an example memory device can include a memory cell string 500 comprising multiple memory cells 505 sharing a common pillar 540, dielectric layer 550, and storage layer 560. The memory cells can be electrically coupled to wordlines, including dummy wordlines 520 and active wordlines 530. "Dummy wordline" herein refers to a wordline that has certain manufacturing defects that would prevent the wordline from controlling multiple level cells (including MLC and TLC). Accordingly, in some implementations, dummy wordlines can be used to control single-level cells. Select gates 510 can control coupling of the pillar 540 to respective bitlines.

Figure 6:
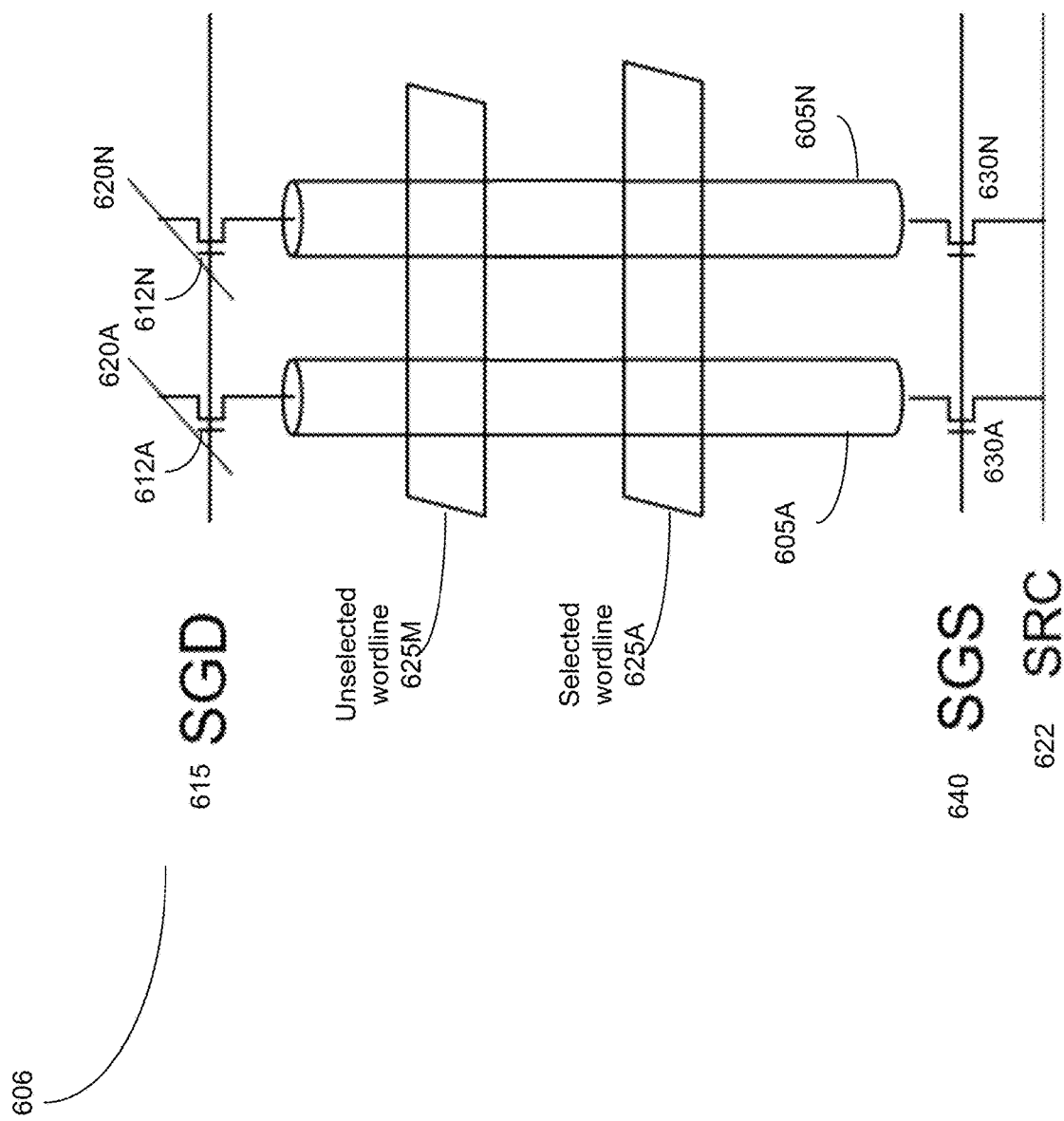
FIG. 6 illustrates a fragment of an example memory array of a memory device operating in accordance with aspects of the present disclosure.

FIG. 6 illustrates a fragment of an example memory array of a memory device operating in accordance with aspects of the present disclosure. As shown in FIG. 6, the memory array 606 may include multiple memory cells of the selected sub-block that are arranged in rows (each corresponding to a conductive wordline 625) and columns (each corresponding to a conductive bitline 620). While FIG. 6 illustrates a two-dimensional structure, memory arrays having various three-dimensional structures can also be utilized for implementing the systems and methods of the present disclosure. In one embodiment, an example three-dimensional structure includes multiple plains, such that each plain has the two-dimensional structure shown in FIG. 6.

Each column of the array 606 may include a string of memory cells that are selectively connected to a common voltage source (SRC) 622. The common voltage source can be coupled to a reference voltage (e.g., the "ground" (Gnd) or a power supply which can be selectively configured to a desired voltage level). The string of memory cells may be connected in series between the corresponding source-side select transistor 630A-630N controlled by the source select gate (SGS) signal 640 and the corresponding drain-side select transistor 612A-612N controlled by drain select gate (SGD) signal 615. In particular, the example memory array 606 includes the selected wordline 625A and the unselected wordline 625M (other wordlines are omitted from FIG. 6). The example memory array 606 further includes a set of bitlines 620A-620N (other bitlines are omitted from FIG. 6) that can be coupled to the corresponding pillars 605A-605N via respective select transistors 612A-612N controlled by the select gate (SGD) signal 615.

As noted herein above, program manager 134 causes the target memory cells to be programmed simultaneously at all logical levels (e.g., L1-15 for QLC). This can be achieved by boosting the pillars in a staggered manner based on the target logical level of respective memory cells, while ramping up the voltage applied to the unselected wordlines to the pass voltage level ($V_{PASS}$) and the voltage applied to the selected wordline(s) to the programming voltage level ($V_{PGM}$).

Figure 7:
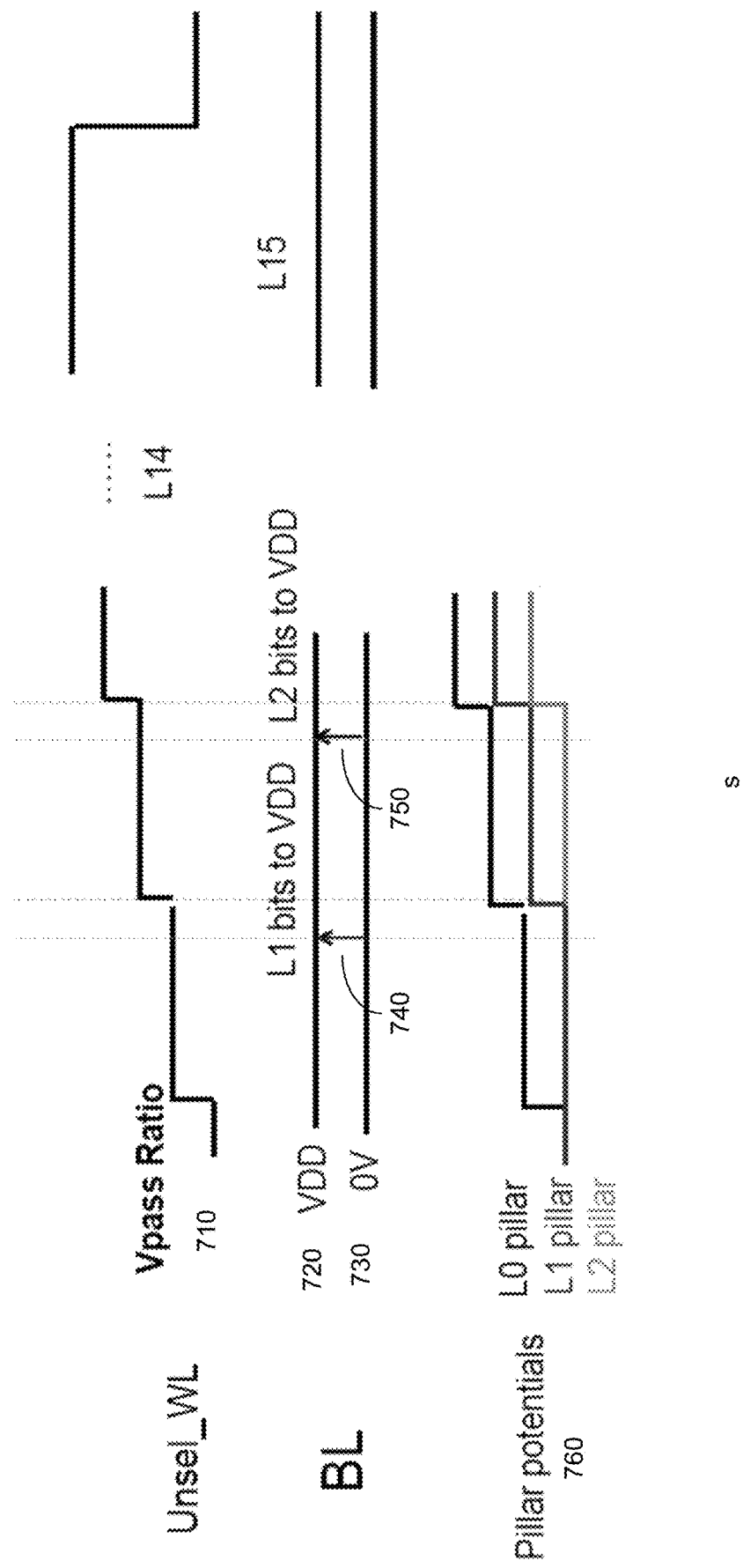
FIG. 7 schematically illustrates example voltage waveforms applied to various portions of a memory array during execution of programming operations by systems and methods of the present disclosure.

FIG. 7 schematically illustrates example voltage waveforms applied to various portions of a memory array during execution of a programming operation by systems and methods of the present disclosure. In an illustrative example, the memory device controller identifies one or more memory cells at the intersection of the target (selected) wordline $WL_n$ and the selected bitline(s)) to be programmed by a programming operation.

As schematically illustrated by FIG. 7, the voltage 710 applied to the unselected wordlines is incremented, by a pre-defined step voltage value, once every time period over a chosen number of time periods, until the voltage reaches the pass voltage level ($V_{PASS}$). The number of time periods can be equal to the number of logical levels (e.g., fifteen time periods for QLC). Similarly, the voltage applied to the selected wordlines (not shown in FIG. 7) is incremented, by the step voltage value, once every time period until the voltage reaches the programming voltage level ($V_{PGM}$).

The L0 bitline(s) (i.e., the bitline(s) that are connected to the memory cells to be programmed to L0 logical level) are kept, over above-referenced the time periods, at the $V_{DD}$ voltage level 720, which causes the L0 pillar potential (i.e., the difference between the unselected wordline voltage 710 and the bitline voltage 720) to be effectively incremented, by the chosen step voltage value, once every time period, thus tracking the waveform of the wordline voltage 710.

The voltages applied to the L1-L14 bitlines (i.e., the bitlines that are connected to the memory cells to be programmed to L1-L14 logical levels) starts at the ground voltage level 730 (e.g., 0V) and then is incremented, by the step voltage value, to the $V_{DD}$ level during the time period having the sequential number which is equal to the number of the logical level. For example, an L1 bitline is driven to the $V_{DD}$ level during time period 2 (line 740 in FIG. 7); an L2 bitline is driven to the $V_{DD}$ level during time period 3 (line 750 in FIG. 7); and an $L_i$ bitline is driven to the $V_{DD}$ level during time period (i+1). Thus, the pillar potentials 760 of the L1-L14 pillars are effectively incremented, by the chosen step voltage value, once every time period in a staggered manner, i.e., with the delay of the number of periods equal to the sequential number of the logical level. For example, the L1 pillar potential is incremented, by the step voltage value, once every time period starting at time period 2; the L2 pillar potential is incremented, by the step voltage value, once every time period starting at time period 3; the L1 pillar potential is incremented, by the step voltage value, once every time period starting at time period (i+1).

Finally, the L15 bitline(s) (i.e., the bitline(s) that are connected to the memory cells to be programmed to L15 logical level) are kept, over above-referenced the time periods, at ground voltage level 730 (e.g., 0V). Thus, the L15 pillar potential receives no boost and tracks the waveform of the wordline voltage 710.

In some implementations, a program verify operation can be performed after applying one or more programing voltage pulses. The program verify operation can involve reading one or more memory cells to which the programming pulse has been applied, in order to determine whether the threshold voltage $V_T$ of the memory cells has reached a desired value.

While the above-described examples are directed to QLC programming algorithms, the systems and methods of the present disclosure can be similarly applied to MLC, TLC, and other algorithms utilized for programming memory cells that are capable of storing one or more data bits.

Figure 8:
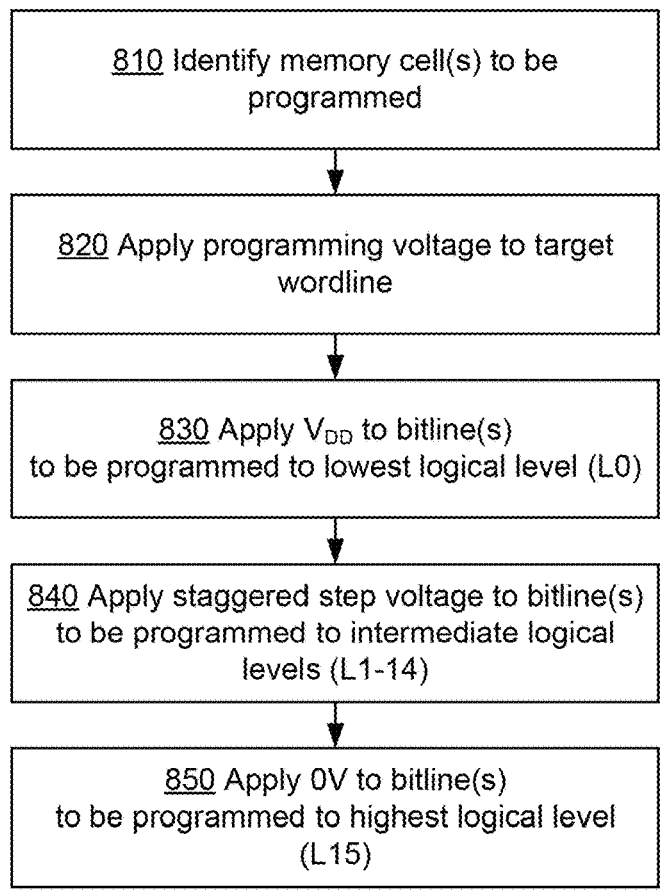
FIG. 8 is a flow diagram of an example method of performing a memory programming operation, in accordance with embodiments of the present disclosure.

FIG. 8 is a flow diagram of an example method of performing a memory programming operation, in accordance with embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the memory sub-system controller 115 and/or the local media controller 135 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. The voltage waveforms are schematically illustrated by FIG. 7.

At operation 810, the controller implementing the method identifies one or more a memory cells to be programmed. In an illustrative example, the program manager 134 implemented by the local media controller 135 of FIG. 1 can receive, from the memory interface 113 of the memory sub-system controller 115, a request to perform a memory access operation on a specified memory device. In one embodiment, the memory access operation involves a programming operation to program the identified memory cells to a specified logical level. The identified memory cells can be addressable by a target wordline and a set of target bitlines, as described in more detail herein above.

At operation 820, the controller causes a programming voltage to be applied to the target wordline. The programming voltage is increased by a pre-defined step voltage value every time period over the number of time periods that corresponds to the number of logical levels to be programmed (e.g., fifteen logical levels for QLC), as described in more detail herein above.

At operation 830, the controller causes the $V_{DD}$ voltage level to be applied, over the number of time periods, to one or more bitlines that are connected to the memory cells to be programmed to the lowest logical level (e.g., L0), as schematically illustrated by waveform 720 of FIG. 7.

At operation 840, the controller causes a staggered step voltage to be applied to one or more bitlines that are connected to the memory cells to be programmed to an intermediate logical level (e.g., L2-L14). The staggered step voltage starts at the ground level and then is boosted to the $V_{DD}$ voltage level during the time period, the sequential number of which corresponds to the sequential number of the target logical level, as schematically illustrated by waveforms 740, 750 of FIG. 7.

For example, the L1 pillar potential is incremented, by a pre-defined step voltage value, once every time period starting at time period 2; the L2 pillar potential is incremented, by the step voltage value, once every time period starting at time period 3; the L1 pillar potential is incremented, by the step voltage value, once every time period starting at time period (i+1). In other words, the voltage level that is applied to L2 can be incremented, by the step voltage value, during time period 2; the voltage level that is applied to L3 can be incremented by the chosen step voltage value during time period 3, etc.

At operation 850, the controller causes the ground voltage level (e.g., 0V) to be applied, over the number of time periods, to one or more bitlines that are connected to the memory cells to be programmed to the highest logical level (e.g., L15), as schematically illustrated by waveforms 730 of FIG. 7.

As noted herein above program manager 134 performs programming operations in two stages: a coarse programming stage, which places the charge levels of the cells close to the desired levels, and a fine programming stage, which places the charge levels of the cells to their respective desired levels. In various implementations, the above-described all level programming technique can be employed at either or both programming stages.

Figure 9:
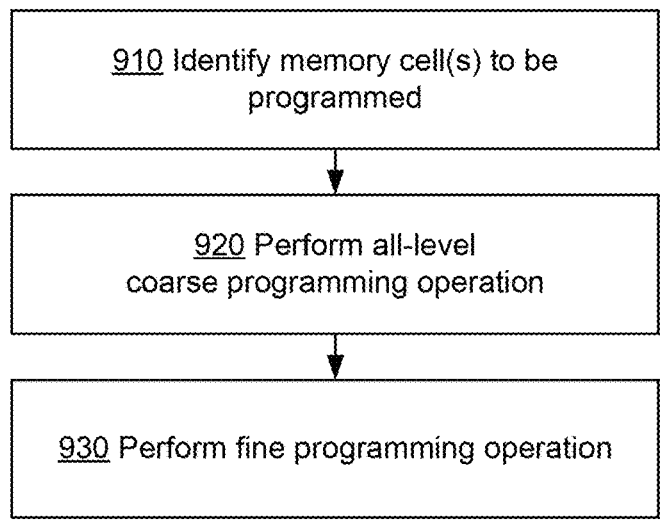
FIG. 9 is a flow diagram of another example method of performing a memory programming operation, in accordance with embodiments of the present disclosure.

FIG. 9 is a flow diagram of another example method of performing a memory programming operation, in accordance with embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the memory sub-system controller 115 and/or the local media controller 135 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 910, the controller implementing the method identifies one or more a memory cells to be programmed. In an illustrative example, the program manager 134 implemented by the local media controller 135 of FIG. 1 can receive, from the memory interface 113 of the memory sub-system controller 115, a request to perform a memory access operation on a specified memory device. In one embodiment, the memory access operation involves a programming operation to program the identified memory cells to a specified logical level. The identified memory cells can be addressable by a target wordline and a set of target bitlines, as described in more detail herein above.

At operation 920, the controller performs a coarse programming operation, which can include one or more programming pulses, such that each pulse is followed by a read strobe. In some implementations, the coarse programming operation can employ the above-described all-level programming technique. The coarse programming operation brings the target memory cells to the vicinity of the intended program verify voltage $PV_N$, where $PV_N$ denotes the program verify voltage level for the N-th programming level (N=1, . . . , 9). Thus, for each memory cell, its resulting program verify level upon completion of operation 920 would differ from the intended program verify voltage $PV_N$ by no more than a predefined voltage levels.

At operation 930, the controller performs a fine programming operation, which can include one or more programming pulses, such that each pulse is followed by a read strobe. In some implementations, the fine programming operation can employ the above-described all-level programming technique. The fine programming operation brings the target memory cells to the intended program verify voltage $PV_N$.

While the above-described examples are directed to QLC programming algorithms, the systems and methods of the present disclosure can be similarly applied to MLC, TLC, and other algorithms utilized for programming memory cells that are capable of storing one or more data bits.

Figure 10:
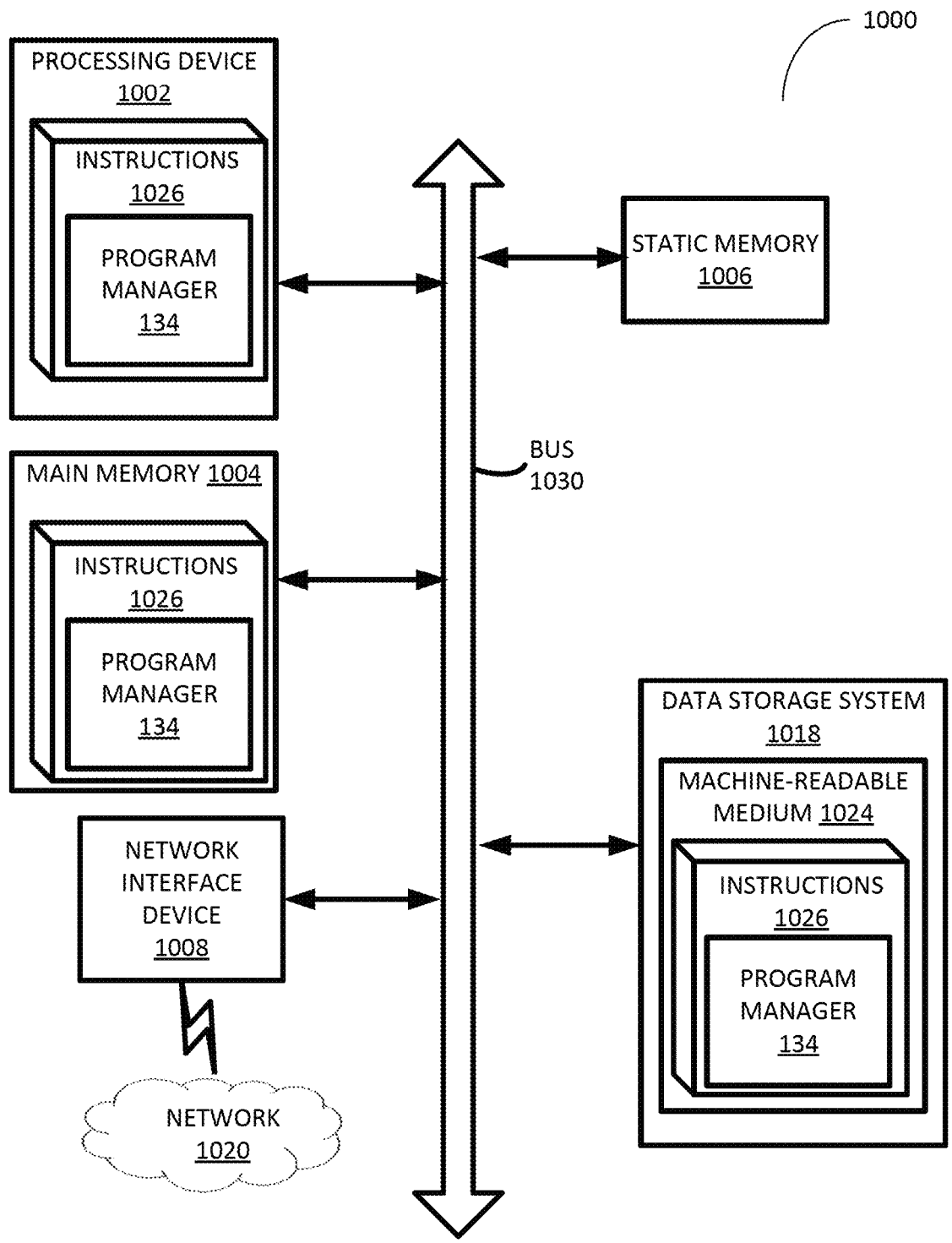
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1019, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1009 to communicate over the network 1020.

The data storage system 1019 can include a machine-readable storage medium 1 104 (also known as a computer-readable medium, such as a non-transitory computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1019, and/or main memory 1004 can correspond to the memory sub-system 110 of FIG. 1.

In one embodiment, the instructions 1026 include instructions to implement functionality corresponding to program manager 134 of FIG. 1 (e.g., instructions implementing methods 800/900).

While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory array comprising a plurality of memory cells electrically coupled to a plurality of wordlines and a plurality of bitlines; and
   a controller coupled to the memory array, the controller to perform operations comprising:
      identifying a set of memory cells for performing a memory programming operation, wherein the memory cells are electrically coupled to a target wordline and a set of target bitlines;
      causing a first voltage to be applied to the target wordline, wherein the first voltage is incremented every time period over a number of time periods that corresponds to a number of threshold voltages to be programmed;
      causing a second voltage to be applied to a first bitline over the number of time periods;
      causing a third voltage to be applied to a second bitline, wherein the third voltage is incremented during a second time period of the number of time periods, wherein the second time period follows a first time period;
      causing a fourth voltage to be applied to a third bitline, wherein the fourth voltage is incremented during a third time period of the number of time periods, wherein the third time period follows the second time period; and
      causing a fifth voltage to be applied to a fourth bitline over the number of time periods.

2. The system of claim 1, wherein the operations further comprise:
   causing a read strobe to be performed with respect to the set of memory cells.

3. The system of claim 1, wherein the first bitline is connected to a subset of memory cells to be programmed to a lowest logical level.

4. The system of claim 1, wherein the second bitline is connected to a subset of memory cells to be programmed to an intermediate lowest logical level.

5. The system of claim 1, wherein the third bitline is connected to a subset of memory cells to be programmed to an intermediate lowest logical level.

6. The system of claim 1, wherein the fourth bitline is connected to a subset of memory cells to be programmed to a highest logical level.

7. The system of claim 1, wherein the operations further comprise:
   causing a fine programming operation to be performed with respect to the set of memory cells, wherein the fine programming operation comprises one or more programming voltage pulses.

8. The system of claim 1, wherein the operations further comprise:
   causing a coarse programming operation to be performed with respect to the set of memory cells, wherein the coarse programming operation comprises one or more programming voltage pulses.

9. A computer-readable non-transitory storage medium comprising executable instructions that, when executed by a controller managing a memory array comprising a plurality of memory cells, cause the controller to perform operations, comprising:

identifying a set of memory cells for performing a memory programming operation, wherein the memory cells are electrically coupled to a target wordline and a set of target bitlines;

causing a first voltage to be applied to the target wordline, wherein the first voltage is incremented every time period over a number of time periods that corresponds to a number of threshold voltages to be programmed;

causing a second voltage to be applied to a first bitline over the number of time periods;

causing a third voltage to be applied to a second bitline, wherein the third voltage is incremented during a second time period of the number of time periods, wherein the second time period follows a first time period;

causing a fourth voltage to be applied to a third bitline, wherein the fourth voltage is incremented during a third time period of the number of time periods, wherein the third time period follows the second time period; and causing a fifth voltage to be applied to a fourth bitline over the number of time periods.

10. The computer-readable non-transitory storage medium of claim 9, wherein the first bitline is connected to a subset of memory cells to be programmed to a lowest logical level.

11. The computer-readable non-transitory storage medium of claim 9, wherein the second bitline is connected to a subset of memory cells to be programmed to an intermediate lowest logical level.

12. The computer-readable non-transitory storage medium of claim 9, wherein the fourth bitline is connected to a subset of memory cells to be programmed to a highest logical level.

13. The computer-readable non-transitory storage medium of claim 9, wherein the operations further comprise:

causing a fine programming operation to be performed with respect to the set of memory cells, wherein the fine programming operation comprises one or more programming voltage pulses.

14. The computer-readable non-transitory storage medium of claim 9, wherein the operations further comprise:

causing a coarse programming operation to be performed with respect to the set of memory cells, wherein the coarse programming operation comprises one or more programming voltage pulses.

15. A method, comprising:

identifying, by a controller managing a memory array comprising a plurality of memory cells, a set of memory cells for performing a memory programming operation, wherein the memory cells are electrically coupled to a target wordline and a set of target bitlines;

causing a first voltage to be applied to the target wordline, wherein the first voltage is incremented every time period over a number of time periods that corresponds to a number of threshold voltages to be programmed;

causing a second voltage to be applied to a first bitline over the number of time periods;

causing a third voltage to be applied to a second bitline, wherein the third voltage is incremented during a second time period of the number of time periods, wherein the second time period follows a first time period;

causing a fourth voltage to be applied to a third bitline, wherein the fourth voltage is incremented during a third time period of the number of time periods, wherein the third time period follows the second time period; and causing a fifth voltage to be applied to a fourth bitline over the number of time periods.

16. The method of claim 15, further comprising:

causing a read strobe to be performed with respect to the set of memory cells.

17. The method of claim 15, wherein the first bitline is connected to a subset of memory cells to be programmed to a lowest logical level.

18. The method of claim 15, wherein the second bitline is connected to a subset of memory cells to be programmed to an intermediate lowest logical level.

19. The method of claim 15, wherein the fourth bitline is connected to a subset of memory cells to be programmed to a highest logical level.

20. The method of claim 15, further comprising:

causing a fine programming operation to be performed with respect to the set of memory cells, wherein the fine programming operation comprises one or more programming voltage pulses.

* * * * *